United States Patent [19]

Baba

[11] Patent Number: 5,172,212

[45] Date of Patent: Dec. 15, 1992

[54] SEMICONDUCTOR HAVING AN IMPROVED ELECTRODE PAD

[75] Inventor: Isao Baba, Fujisawa, Japan

[73] Assignee: Kabushiki Kaisha Toshiba, Kawasaki, Japan

[21] Appl. No.: 731,482

[22] Filed: Jul. 17, 1991

[30] Foreign Application Priority Data

Jul. 17, 1990 [JP] Japan .................................. 2-188449

[51] Int. Cl.⁵ .................................................. H01L 23/54
[52] U.S. Cl. ...................................... 257/738; 257/751; 257/765; 257/780
[58] Field of Search .................................... 357/67, 71

[56] References Cited

U.S. PATENT DOCUMENTS

| | | | |
|---|---|---|---|
| 4,742,023 | 5/1988 | Hasegawa | 357/67 |
| 4,937,652 | 6/1990 | Okumura et al. | 357/67 |
| 4,974,054 | 11/1990 | Anjo | 357/67 |

Primary Examiner—Rolf Hille
Assistant Examiner—S. V. Clark
Attorney, Agent, or Firm—Foley & Lardner

[57] ABSTRACT

A semiconductor device is provided with a semiconductor substrate, an oxide film formed on the surface of the semiconductor substrate, an electrode pad formed on a region arbitrarily limited to the surface of this oxide layer, an insulation protection film that is laminated and formed on a peripheral portion of the electrode pad and the surface of the oxide layer where a central portion of this electrode pad is exposed, and a metal barrier film that is formed by covering the surface of a central exposed portion of the electrode pad, to prevent the corrosion of an electrode surface when wires are bonded and the electrode pad and wires are connected. This semiconductor device is manufactured by a method including a step of forming an electrode pad on an oxide film, a step of laminating an insulation protection film on the electrode pad and the oxidation film and of implementing patterning by a resist film onto the insulation protection film and for the selective removal of the insulation protection film so that an opening is made in the insulation protection film in a portion on the electrode pad, a step of laminating a metal barrier film on the electrode pad and the resist film, and a step of removing the resist film so that a portion of the resist film in the metal barrier film is removed.

4 Claims, 3 Drawing Sheets

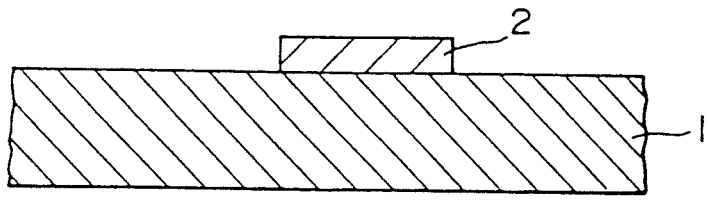
FIG. IA
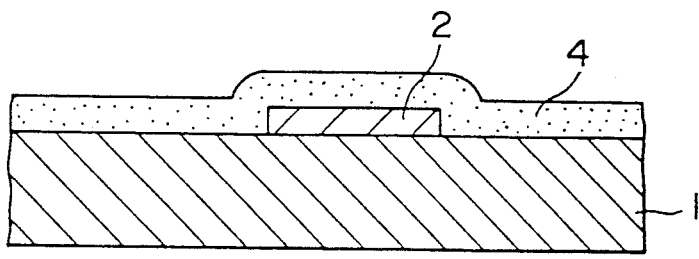
FIG. IB
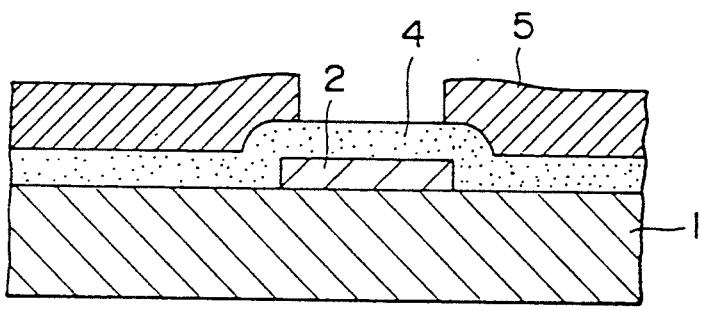
FIG. IC
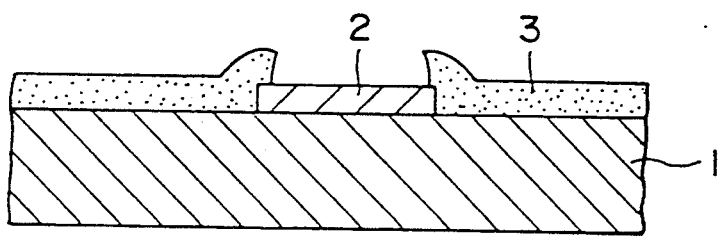
FIG. ID
PRIOR ART

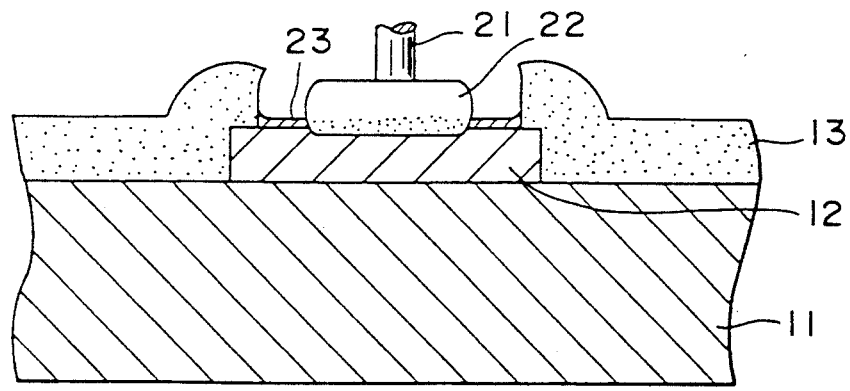
FIG. 3
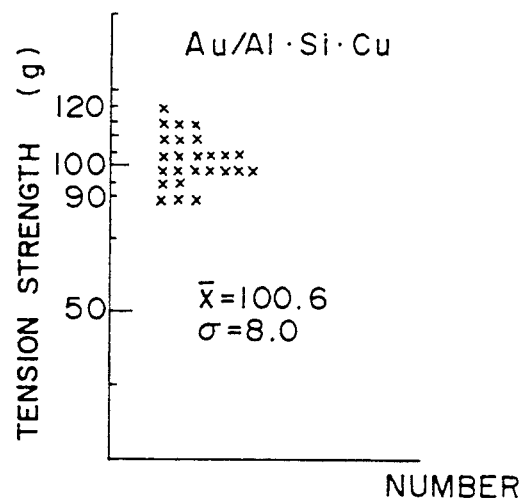
FIG. 4(a)
FIG. 4(b)

SEMICONDUCTOR HAVING AN IMPROVED ELECTRODE PAD

BACKGROUND OF THE INVENTION

The present invention relates to a semiconductor having an improved electrode pad, and method of manufacture of device using such.

Conventionally, the electrode pad portion of semiconductor devices connected with package wiring by wire bonding is configured as shown in FIG. 1D.

In FIG. 1D, the numeral 1 represents an oxide film ($SiO_2$) formed on a silicon (Si) substrate (not shown in the figure), the numeral 2 represents an electrode pad, and the numeral 3 represents a passivation film.

The electrode pad 2 covers the oxide film 1 and is comprised of an aluminum (Al) or Al-Si alloy film for example.

The passivation film 3 is configured from a phosphosilicate glass (PSG) and with the exception of the portion for which wire bonding is performed, is covered by the surface of the electrode pad 2 and the oxide film 1 so that the surface is protected.

Such a structure is formed using the processes shown in FIGS. 1A through 1D.

First, the sputter method is used to deposit Al or Al-Si to a thickness of approximately 8000 Å on the oxide film 1, and the photolithography method is used to form the electrode pads 2 as shown in FIG. 1A. When this is done, the wiring portion (not shown in the figure) is formed to the electrode pad at the same time.

Then, the chemical vapor deposition (CVD) method or a similar method is used to laminate PSG to a thickness of approximately 10000 Å on the oxide film 1 and the electrode pad 2, and form the passivation film 4 as shown in FIG. 1B.

Then, as shown in FIG. 1C, a photoresist 5 is applied to a thickness of approximately 1.5 µm on the passivation film 4 and patterning is implemented, and used as the mask to etch the passivation film 4. By this, the passivation film 4 is made to have an opening only on the electrode pad 2, so that the electrode pad 2 is exposed at this opening portion. After this, the photoresist film 5 is removed to produce the shape shown in FIG. 1D.

Wire bonding is implemented with respect to the exposed portion of the electrode pad 2 of an element of this type. By this, after the wiring processing has been performed, resin encapsulation is performed to form the package, and thus corrosion prevention of the electrode pad 2 is facilitated by this package.

However, when elements are housed inside a package made of a plastic resin, the aluminum (Al) of the pad reacts with halogen ions of chlorine (Cl) and the like, alkali ions such as natrium (Na), and acidic ions such as sulfur oxides ($SO_4^-$) and the like, to cause faults such as pad corrosion as has been proven in moisture resistance testing for plastic packages.

As has been described above, Cl ions are one of the causes of this corrosion and when this occurs, the reaction is as described below.

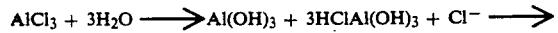

-continued

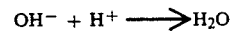

Here, the $Al(OH)_2Cl$ is a soluble salt and so assists the progress of corrosion, and brings on element faults and shortens the element life.

Not only this, the size of an electrode pad is normally approximately 100 µm² but in order to miniaturize an increase in the chip size and the number of electrode pads, there is the tendency for the pad size to be made smaller but when the pad is of an Al-Si-Cu series alloy, making the pad smaller reduces the positioning surface area for gold (Au) wires in the bonding and causes the problem of facilitating a reduction in the bonding strength.

In addition, when there is an electrode pad of an Al-Si-Cu series alloy, deposition and oxidation of copper (Cu) and the like, obstructs the formation of an Au-Al alloy layer between the surface of the pad and the gold (Au) ball of the bonding portion and so there is also a remarkable decrease in the bonding strength.

It has been thought that these problems could be eliminated by removing the Cu from the alloy material used in the electrode pad. However, the reason why Cu is added to the alloy material used in the electrode pad is so that it can act as a countermeasure to electromigration of the Al wiring, and this Cu is essential for making the wiring finer, and also to reduce the amount of increase in the power consumption.

Therefore, it is necessary to have some countermeasure to prevent the lowering of the bonding strength due to the oxidation and the deposition of the copper, etc. when copper is not removed from the electrode pad alloy material.

In such a conventional semiconductor device as has been described above, the Al of the pad reacts with the halogen ions such as Cl and the like, alkali ions such as Na and the like, and acid ions such as acidic ions such as $SO_4^-$ and the like, to cause the problem of faults such as pad corrosion and the like, and to reduce the Au wire bonding positioning surface area when the pad is made smaller and therefore cause the additional problem of a lowered bonding strength.

SUMMARY OF THE INVENTION

In the light of these problems associated with the conventional art, the present invention has as an object the provision of a semiconductor device in which the lowering of the bonding strength due to the deposition and oxidation of Cu is prevented when the electrode pad is of the Al-Si-Cu type, and in which the chemical reaction that causes pad corrosion of the electrode bad is prevented.

In order to achieve the object, the semiconductor device of the present invention is provided with an electrode pad that has a metal barrier film covering the surface to perform wire bonding.

The method of manufacture of the semiconductor device of another aspect of the present invention, comprises a step of forming an electrode pad on an oxide film, a step of laminating an insulation protection film on the electrode pad and the oxidation film and implementating patterning by a resist film onto the insulation protection film and for the selective removal of the insulation protection film so that an opening is made in the insulation protection film in a portion on the electrode pad, a step of laminating of a metal barrier film on the electrode pad and the resist film, and a step of removing the resist film so that a portion of the resist film in the metal barrier film is removed.

According to the present invention, covering the electrode pad by the metal barrier film prevents the reaction with the halogen ions such as Cl and the like, alkali ions such as Na and the like, and acid ions such as acidic ions such as $SO_4{}^-$ and the like and therefore prevents pad corrosion.

In addition, even in cases where the metal of the electrode pad is of an Al-Si-Cu system, the deposition and oxidation of the Cu is prevented by the metal barrier film and so it is possible to prevent a lowering of the bonding strength.

According to the present invention as has been described above, the the metal barrier film prevents the electrode pad from reacting with the halogen ions, the alkali ions and the acid ions and so it is possible to prevent the shortening of the life of the electrode pad because of corrosion.

Not only this, even in cases where the metal of the electrode pad is of an Al-Si-Cu series, the deposition and oxidation of the Cu is prevented by the metal barrier film and so it is possible to realize the prevention of the lowering of the bonding strength, so that it is possible to make the electrode pad more compact and without sacrificing the bonding strength, and therefore promote higher levels of integration.

BRIEF DESCRIPTION OF THE DRAWINGS

In the appended figures,

FIGS. 1A-1D are sectional views describing the process of manufacture of a conventional semiconductor;

FIG. 3 is a sectional view showing the bonding structure in a semiconductor device manufactured by the processes shown in FIGS. 2A-2E; and FIG. 4 is a histogram showing the results of tension strength testing, with FIG. 4 (a) showing the tension strength of an element having a conventional bonding structure, and FIG. 4 (b) showing the tension strength of an element according to an embodiment of the present invention.

DETAILED DESCRIPTION OF THE PREFERRED EMBODIMENTS

The following is a description of embodiments of the present invention, with reference to the appended drawings.

Figure 2A:
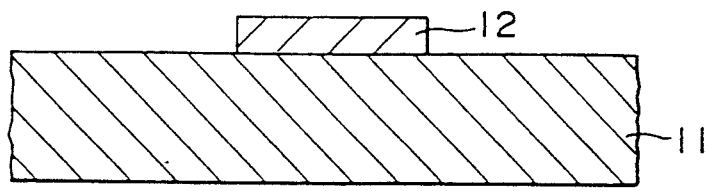
FIGS. 2A-2E are sectional views describing the process of manufacture of a semiconductor device relating to a first embodiment of the present invention.
Figure 2B:
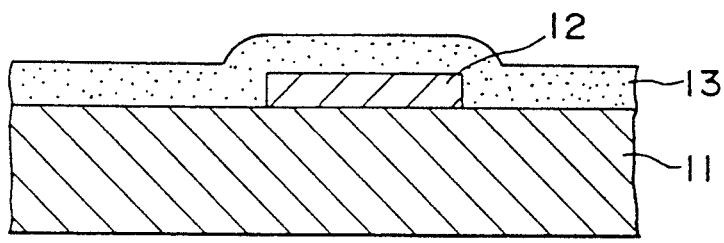
Figure 2C:
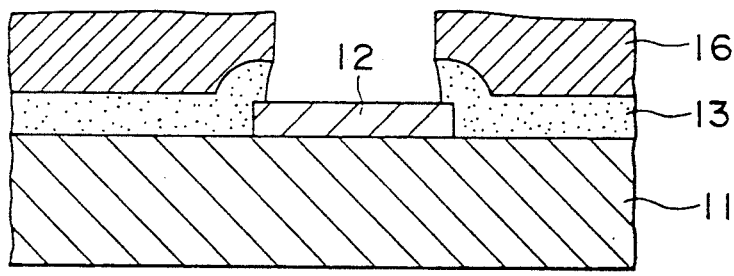
Figure 2D:
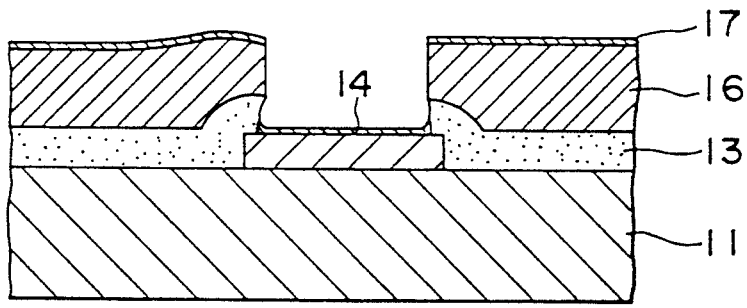
Figure 2E:
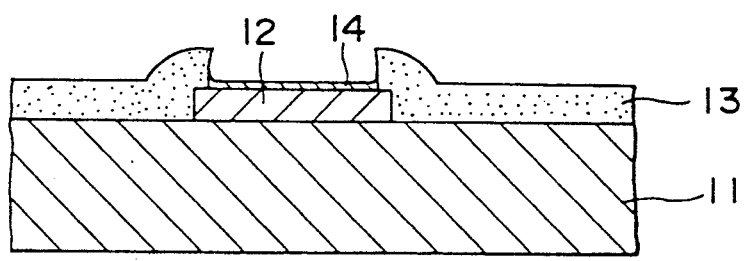

First, in FIG. 2E, numeral 11 is an oxide film ($SiO_2$) that is formed on a silicon substrate (not indicated in the figure), 12 is an electrode pad, and 13 is a passivation film.

The electrode pad 12 is not covered by the passivation film 13 and that exposed surface is covered by a metal barrier film 14 across its entire surface.

The metal that is used in this metal barrier film 14 has a corrosion resistance and resists reacting with the aluminum (Al) and the gold (Au). Palladium (Pd), platinum (Pt) or titanium (Ti) can be used, for example.

In addition, the thickness of the metal barrier film 14 is to a degree so that the gold (Au) ball material can easily protrude when bonding, and is approximately 500 Å for example.

Such a semiconductor device is formed by the processes shown in FIGS. 2A through 2E, and the following is a detailed description of these processes.

First, Al or Al-Si is deposited by the sputter method to a thickness of approximately 8000 Å onto the oxide film 11 and then a photolithographic method is used to form the oxide film 11 as shown in FIG. 2A.

Then, the CVD method or the like is used to laminate PSG to a thickness of approximately 1000 Å onto the oxide film 11 and the electrode pad 12 to form the passivation film 13 as shown in FIG. 2B.

Then, a photoresist film 16 is applied to a thickness of approximately 1.5 μm onto the passivation film 13 and this resist film is then used as the mask and the passivation film 13 etched, so that an opening is made only on the electrode pad 12 and the electrode pad 12 exposed as shown in FIG. 2C.

After this, the sputter method is used to laminate platinum (Pd) to a thickness of approximately 500 Å while the resist film 16 remains.

When this sputtering is performed, the Pd is dispersed from the direction approximately vertical when seen from the surface of the elements in FIGS. 2A through 2E and so the Pd is deposited to only the surface on the element that is perpendicular with respect to the direction of dispersal. Accordingly, the wall surface inside the opening on the metal barrier film 14 in the passivation film 13 and the photoresist film 16 is approximately parallel to the direction of dispersion of the Pd and so the Pd is not laminated to the side walls, and is laminated only to the surface of the resist film 16 and the surface of the electrode pad 12. As a result, the metal films 14 and 17 shown in FIG. 2D are formed.

Finally, the removal of the resist film 16 removes the metal film 17 on the resist film 16. By this, as shown in FIG. 2E, there is formed an element that has only the electrode pad 12 covered by the metal barrier film 14, as shown in FIG. 2E.

Wire bonding with respect to an element in a state such as this, is performed for that portion that is covered by the metal barrier film 14 of the electrode pad 12.

By this bonding, the Au ball material (wire) protrudes from the metal barrier film 14 and reacts so as to form an alloy layer with the Al, so that the status shown in FIG. 3 is obtained as a result.

In this figure, numeral 21 is an Au wire, 22 is a ball portion that is connected to that pad 12, and 23 is a metal barrier film that remains in the periphery of the ball portion 22. An alloy layer of Al and Au at the connection portion between the ball portion 22 and the electrode pad 12, and securely connects both the electrode pad 12 and the ball portion 22, with the periphery of the connection portion on the surface of the electrode pad 12 being covered by the metal barrier film 23 so that corrosion resistance is ensured.

The following is a detailed description of a comparison of the conventional problem points by way of describing the effects of a semiconductor device of the present embodiment.

a) First, with a conventional pad, the Al is exposed and so when there is moisture resistance testing of the plastic package and the like, there is corrosion of the Al and pad faults occur.

With the present embodiment, the surface of the Al which is easily corroded is covered by a metal barrier film and so the corrosion of the Al is prevented.

The results shown in the table below were obtained by performing comparison testing of a conventional element and the present embodiment. Moreover, a 28-pin SOP was used as the evaluation sample, and the method of evaluation was the PCT (pressure cooker test).

TABLE

| Elapsed time | 20 | 60 | 100 | 200 | 300 | 400 | 500 |
|---|---|---|---|---|---|---|---|
| No Pd film (conventional element) | 0/20 | 0/20 | 0/20 | 1/20 | 3/19 | 10/16 | 6/6 |
| Pd film present (present embodiment) | 0/20 | 0/20 | 1/10 | 0/19 | 0/19 | 1/19 | 18/18 |

As is shown in the table, with a conventional element (that does not have a barrier metal layer of Pd), faults begin to occur when 200 hours have passed, and faults continue to occur after this so that it can be assumed that the life of the element has expired.

In contrast, with an element according to the present embodiment and that has a metal barrier film (of Pd), there one fault after 100 hours has passed but no further faults until 300 hours passed and it can be assumed that the fault at 100 hours was an isolated one. Faults begin to occur after the elapse of 400 hours and faults occur in all after the elapse of 500 hours and so this can be though of as the life of the element.

Accordingly, unlike the conventional element where faults begin to occur after 200 hours, an element of the present embodiment has faults beginning to appear at 400 hours and so the life is doubled, and the effect of the Pd film can be confirmed.

b) With the conventional bonding pad structure, that is, with the structure where the pad of the bonding portion is exposed, when the metal of the pad is an Al-Si-Cu series, the deposition and oxidation and the like of the Cu etc. mean that the Au-Al allow layer with pad surface and the ball of the bonding wires is difficult to form and this brings on a lowering of the bonding strength. This lowering of the bonding strength appears more strongly when the pad becomes smaller.

In contrast, if there is the bonding structure of the present embodiment, the provision of the metal barrier film on the pad prevents this lowering of the bonding strength.

FIGS. 4 (a) and 4 (b) are histograms that show the results of testing the tension strength of the bonding portion of 25 of each type of element, with FIG. 4 (a) showing the results for a conventional element, and FIG. 4 (b) showing the results for an element of the present embodiment. The vertical axis of this histogram is the tensile strength and the horizontal axis is the number of elements, with the tensile strength being shown with respect to the number of elements.

First, in FIG. 4 (a), the minimum value is 90 grams, and the maximum value is 120 grams, with the values concentrating around 100 grams and the average value being 100.6 grams and the standard deviation being 8.0.

Then, in FIG. 4 (b), the minimum value is 100 grams, the maximum value is 125 grams, with the values concentrating around 120 grams and the average value being 118.5 grams and the standard deviation being 7.6.

Accordingly, as is clear from even looking at the average value, the device of the present embodiment has a greater tensile strength than the conventional device, in that a strong bonding strength is obtained, and a high value for the strength is obtained as seen from the standard deviation, and the effect of the Pd film is confirmed with respect to the bonding strength.

What is claimed is:

1. A semiconductor device, comprising:
   a semiconductor substrate having a plate shape;
   an oxide layer formed on the plate surface of said semiconductor substrate;
   an electrode pad formed on a predetermined region arbitrarily limited to the surface on said oxide layer;
   an insulation protection film that is laminated and formed on a peripheral portion of said electrode pad and the surface of said oxide layer such that a central portion of said electrode pad is exposed;
   a metal barrier film covering the surface of said exposed central portion of said electrode pad to prevent corrosion of an electrode surface when wire is bonded to connect said electrode pad and wire and
   a gold wire having a ball portion which is connected through said barrier film to said electrode pad by bonding.

2. The semiconductor device of claim 1, additionally provided with:
   an alloy layer for connecting said wire to said electrode pad, said alloy layer being comprised of a gold-aluminum (Au-Al) alloy that connects said wire and pad.

3. The semiconductor device of claim 1, wherein said opening portion which is formed in a passivation film as said insulation protection film, has a patterning photoresist film applied, and said patterning photoresist film is used as a mask for the etching and formation of said passivation film.

4. The semiconductor device of claim 3, wherein said patterning photoresist film used as the mask when etching is performed is applied and then said patterning photoresist film and said metal barrier film are completely covered from the direction of the top of an opening portion of said metal barrier film which is covered by the patterning photoresist film is removed along with the patterning photoresist film and the metal barrier film formed.

* * * * *